US009349613B1

(12) United States Patent
Baloglu et al.

(10) Patent No.: US 9,349,613 B1
(45) Date of Patent: *May 24, 2016

(54) ELECTRONIC PACKAGE WITH EMBEDDED MATERIALS IN A MOLDED STRUCTURE TO CONTROL WARPAGE AND STRESS

(75) Inventors: Bora Baloglu, Chandler, AZ (US); Jeffrey R. Watson, Redmond, WA (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/614,648

(22) Filed: Sep. 13, 2012

(51) Int. Cl.
| H01L 21/00 | (2006.01) |
| H01L 23/34 | (2006.01) |
| H01L 23/28 | (2006.01) |
| H01L 23/29 | (2006.01) |
| H01L 21/56 | (2006.01) |

(52) U.S. Cl.
CPC ............ *H01L 21/563* (2013.01); *H01L 21/565* (2013.01); *H01L 2924/183* (2013.01); *H01L 2924/1811* (2013.01); *H01L 2924/1815* (2013.01)

(58) Field of Classification Search
CPC ..... H01L 21/56; H01L 21/563; H01L 21/565; H01L 21/566; H01L 2924/1815; H01L 2924/1811; H01L 2924/181; H01L 2924/183

USPC ........... 257/82, 687, 783, 787, 789, 790, 795, 257/669, 724, E21.502–E21.504, E23.116, 257/E23.126; 438/127, 112

See application file for complete search history.

(56) References Cited

U.S. PATENT DOCUMENTS

| 2002/0056561 A1* | 5/2002 | Yaguchi et al. ............... 174/52.1 |
| 2003/0000736 A1* | 1/2003 | Sathe ............................ 174/255 |
| 2003/0168749 A1* | 9/2003 | Koike ............................ 257/791 |
| 2004/0147060 A1* | 7/2004 | Seo ............................... 438/106 |
| 2005/0029666 A1* | 2/2005 | Kurihara et al. ............... 257/772 |
| 2005/0140005 A1* | 6/2005 | Huang et al. .................. 257/737 |
| 2011/0127642 A1* | 6/2011 | Zhang et al. .................. 257/618 |

* cited by examiner

*Primary Examiner* — Fernando L Toledo
*Assistant Examiner* — Aaron Gray
(74) *Attorney, Agent, or Firm* — McAndrews, Held & Malloy

(57) ABSTRACT

A method and system are provided for an electronic package with embedded materials in a molded structure to control warpage and stress. A first material can be deposited on a substrate with a semiconductor die. The substrate can be a coreless substrate. The substrate with the semiconductor die can be placed in a mold tool that when closed defines a space about the semiconductor die. A second material, such as an epoxy mold compound, for example, can be applied to the defined space to produce a mold cap in which the first material is at least partially embedded in the second material. The first and second materials can have a different modulus and/or coefficient of thermal expansion. The first material can be used to cover electrical components on a surface of the substrate. In some instances, more than one material can be at least partially embedded in the second material.

16 Claims, 11 Drawing Sheets

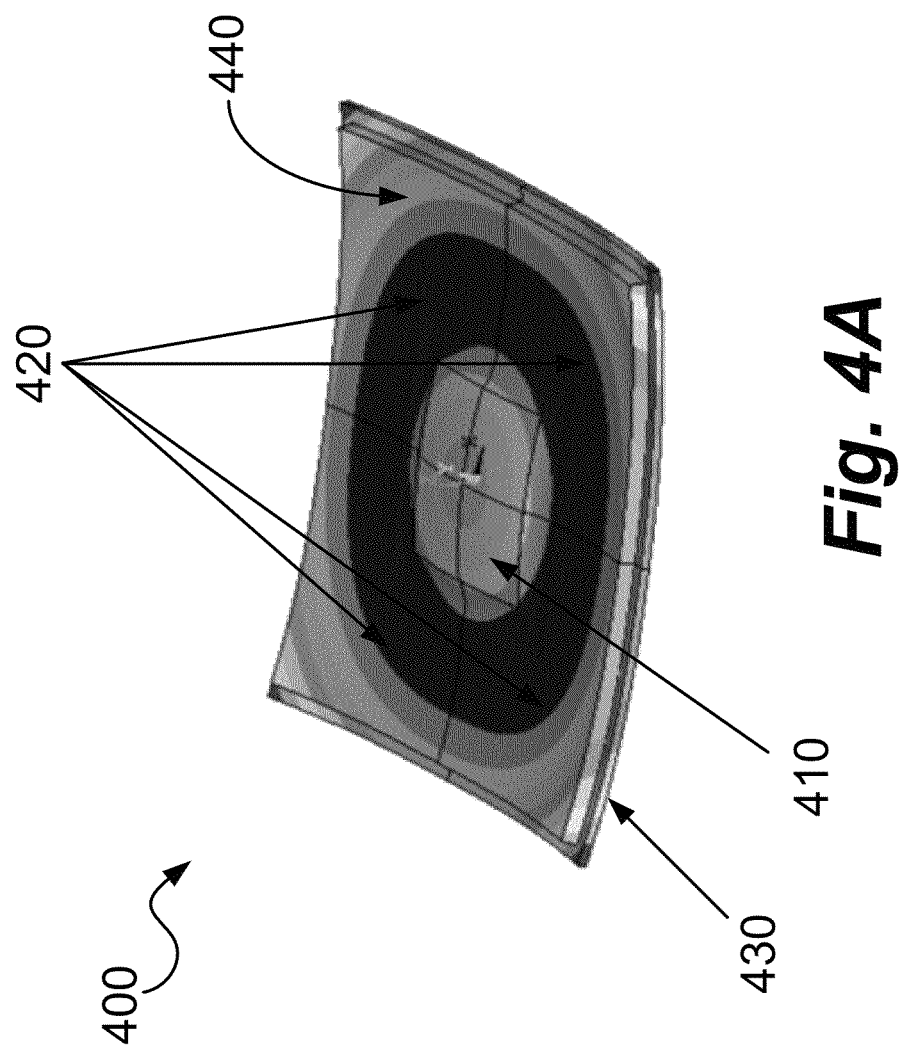

ELECTRONIC PACKAGE WITH EMBEDDED MATERIALS IN A MOLDED STRUCTURE TO CONTROL WARPAGE AND STRESS

CROSS-REFERENCE TO RELATED APPLICATIONS/INCORPORATION BY REFERENCE

This application makes reference to U.S. patent application Ser. No. 13/564,567, titled "Design and Method for Controlling Molding Compound Geometry Around a Semiconductor Die", filed Aug. 1, 2012; U.S. patent application Ser. No. 13/546,870, titled "Die Seal Design and Method and Apparatus for Integrated Circuit Production", filed Jul. 11, 2012; and U.S. patent application Ser. No. 13/614,631, titled "Molded Electronic Package Geometry to Control Warpage and Die Stress", filed Sep. 13, 2012. The entire content of each of the patent applications listed above is hereby incorporated herein by reference in its entirety.

FIELD OF TECHNOLOGY

Certain embodiments of the disclosure relate to packaging of electronic devices. More specifically, certain embodiments of the disclosure relate to an electronic package with embedded materials in a molded structure to control warpage and stress.

BACKGROUND

Electronic packages can be molded in a plastic compound to improve the interconnect reliability between a semiconductor die and a substrate and to help keep the substrate flat for assembly onto a circuit board. The mold compound and the substrate can have different coefficients of thermal expansion, glass transition temperatures, shrink rates, and/or mechanical rigidity, which can cause warping and/or stresses on the semiconductor die and/or on the substrate when there are room temperature changes or during temperature cycling.

Further limitations and disadvantages of conventional and traditional approaches will become apparent to one of skill in the art, through comparison of such systems with some aspects of the present disclosure as set forth in the remainder of the present application with reference to the drawings.

BRIEF DESCRIPTION OF SEVERAL VIEWS OF THE DRAWINGS

FIG. 4A is a perspective view of an example of a displacement contour plot of simulated warping in a mold cap with constant thickness.

DETAILED DESCRIPTION

Figure 1A:
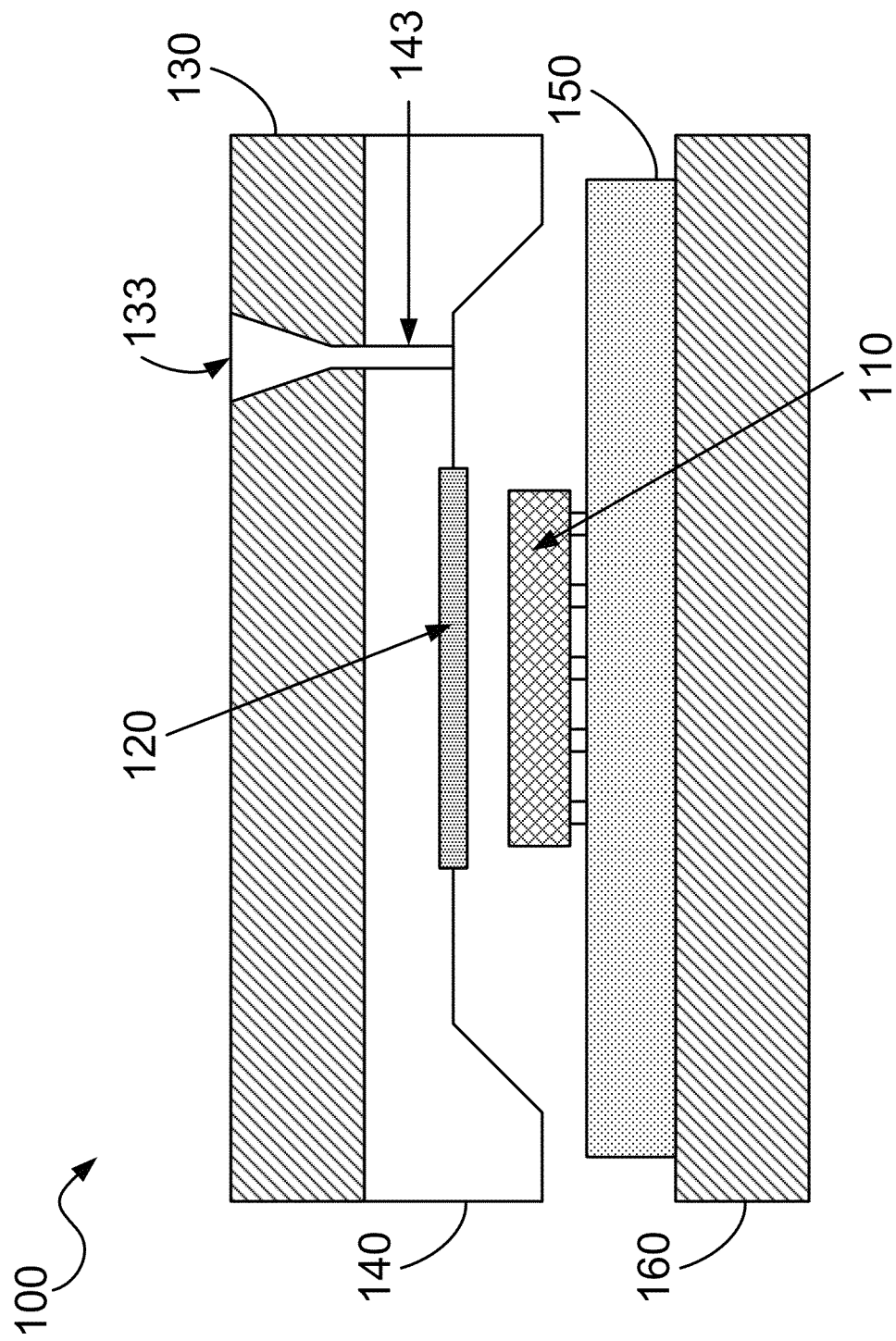
FIGS. 1A-1C are each a schematic view of an example of a mold tool to produce a mold cap in an electronic package.

Certain implementations described in the disclosure relate to a method and system for an electronic package with embedded materials in a molded structure to control warpage and stress. Aspects of the implementations disclosed include producing an electronic package having a substrate, a semiconductor die on the substrate, and a mold cap about the semiconductor die. A first material, which can be referred to as an embedded or form material, can be deposited on the substrate. The substrate can be a coreless substrate, for example. The substrate can be placed in a mold tool that, when closed, defines a space about the semiconductor die. A second material, such as an epoxy mold compound, for example, can be applied to the defined space to produce a mold cap in which the first material is at least partially embedded in the second material. The first and second materials can have different modulus and/or coefficient of thermal expansion. In some instances, the first material can be used to cover electrical components on a surface of the substrate.

A semiconductor die can be covered or encapsulated in mold material, which may also be referred to herein as a mold compound or molding material. Examples of the reasons for using a mold compound include, but need not be limited to, the protection of die connections, the protection of the die from general mechanical forces, the provision of a base for electrical connection fanout, the provision of a base for mounting a heat sink, and the control of warpage of the semiconductor die and/or of the overall integrated circuit package. A difference in the coefficient of thermal expansion (CTE) of the semiconductor die and the mold material can create stresses in the semiconductor die at the side faces. In some instances, these stresses can lead to cracking of the semiconductor die, a reduction in yields and a rise in production costs.

Using an "undercut" or "UC" can control and/or reduce the stresses that appear at the "die-to-mold" surface. An undercut can be produced when, during covering or encapsulation of the semiconductor die, a flat die seal is used that is larger than the surface of the semiconductor die surface onto which the die seal is compressed. A die seal can be used to ensure a mold free top surface of the semiconductor die. When a flat die seal is pressed against the top surface of the semiconductor die, any portion of the die seal that extends beyond the edges of the top surface of the semiconductor die tends to bulge in the direction of the force placed upon the die seal, creating a semi-circular convex shape. As the mold material flows into the tool used to cover or encapsulate the semiconductor die, the convex shape of the bulging die seal extension, which partially defines the shape of the space or cavity formed by the mold tool, causes the mold material to take on a concave semi-circular shape along the sides of the semiconductor die.

The implementations disclosed herein may address reliability issues in what are referred to as Flip-Chip molded Ball Grid Array (FCmBGA) packages, for example. Other types of electronic packages, however, can make use of various aspects of the implementations described in this disclosure. Moreover, warpage or warping can refer to variations of a surface of a substrate or of a surface of a semiconductor die from a reference plane and/or from a center point. In some instances, warpage or warping can also be referred to as bowing.

Figure 1B:
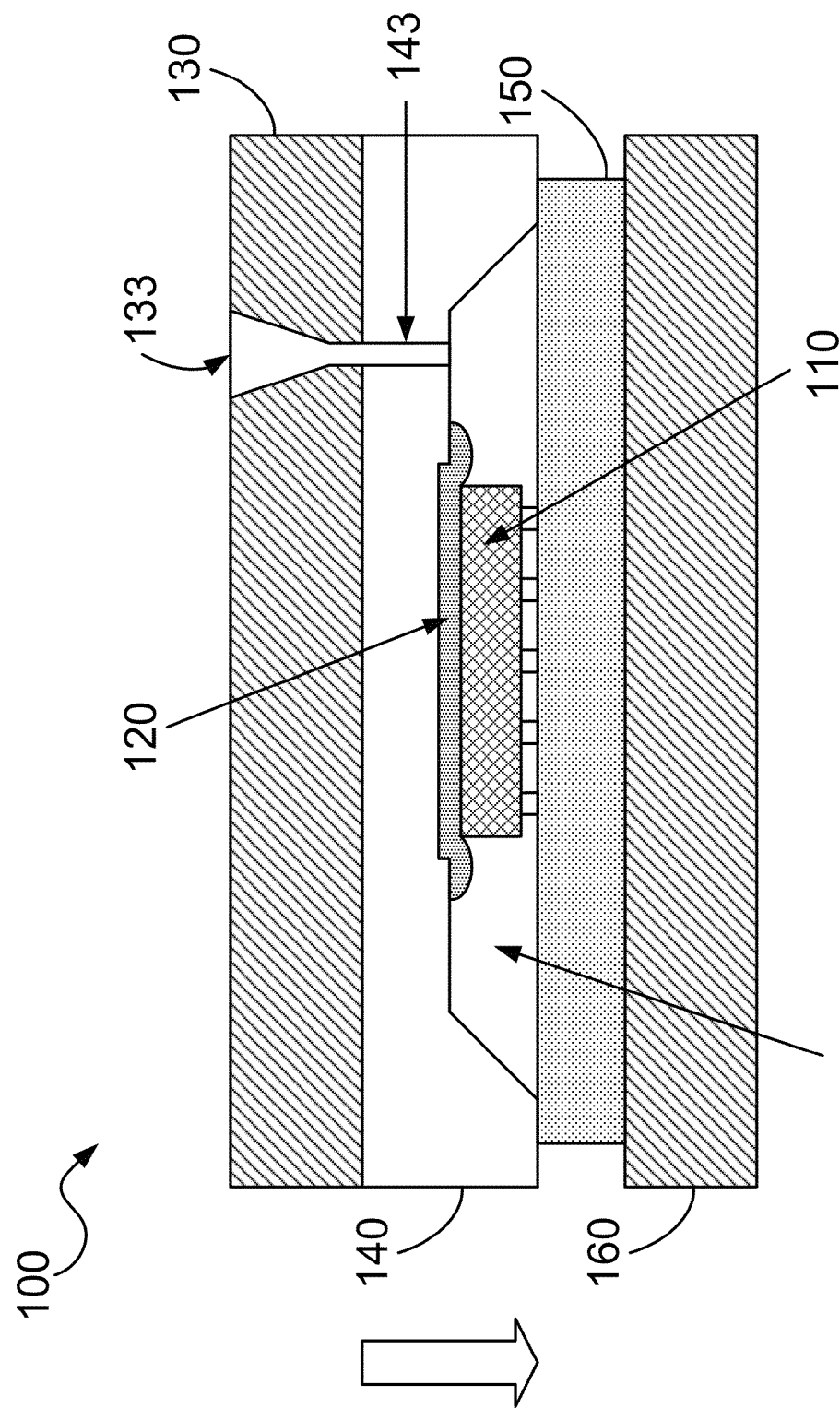
Figure 1C:
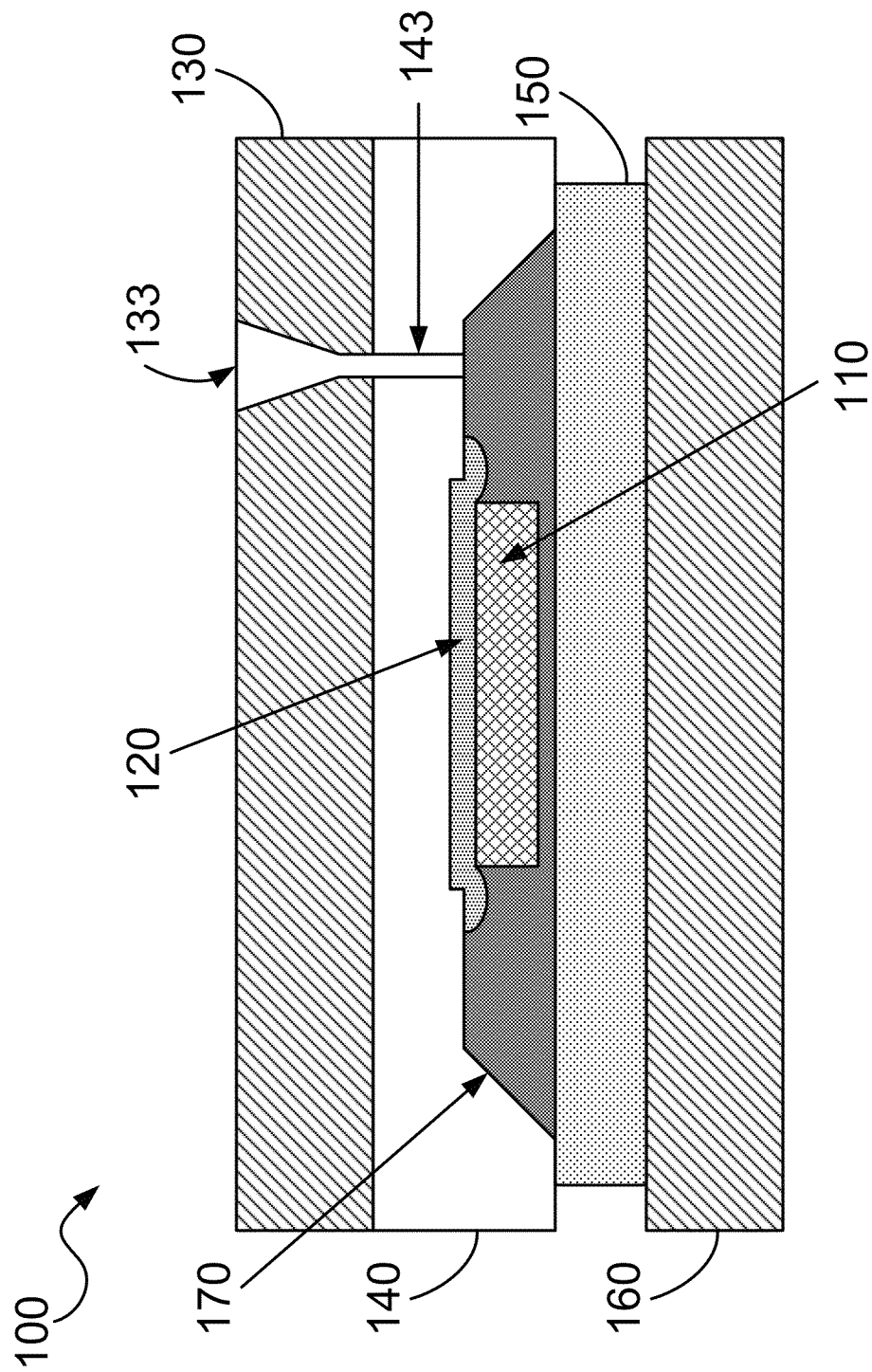

FIGS. 1A-1C are each a schematic view of an example of a mold tool to produce a mold cap in an electronic package. As illustrated in FIG. 1A, a mold tool 100 can include an upper chase 130, a middle plate 140 (also referred to herein as the middle layer 140 and/or the middle chase 140) to which a die seal 120 can be mounted, and a lower chase 160. The die seal 120 can be a flexible die seal. Typically, the die seal 120 can be partially embedded into the middle plate 140. In some instances, however, the die seal 120 can be fully embedded into the middle plate 140. Moreover, the die seal 120 can be a silicon rubber material such as Softec™ available from ASM (http://www.asm.com/). The semiconductor die 110 is shown mounted to a substrate 150, which is resting on the lower chase 160. The substrate 150 can be a thin or coreless substrate, for example. The substrate 150 may also, for example, comprise a die material.

During the operation of packaging, as shown in FIG. 1B, downward pressure on the upper chase 130 causes the middle plate 140 to bear down upon the substrate 150, thereby clamping the substrate against the lower chase 160 and closing the mold tool 100. The downward movement causes the die seal 120 to press down upon the semiconductor die 110, protecting the upper surface of the semiconductor die 110 from the mold material used to cover parts of the semiconductor die 110, which enters a cavity or space 165 of the mold tool 100 via molding gate elements 133/143 in the upper chase 130 and the middle layer 140, respectively. The cavity or space 165 is defined by the geometry of the middle plate 140, the semiconductor die 110, and the substrate 150. The pressure of the middle plate 140 upon the flexible material of the die seal 120 can deform those portions of the die seal 120 that extend beyond the upper surface of the semiconductor die 110, forming a downward bulge at each edge of the semiconductor die 110.

As illustrated by FIG. 1C, a mold material 170 used to form a mold cap can be shaped by the boundaries formed by the side faces of the semiconductor die 110, the die seal 120, the middle plate 140, and the substrate 150. After an appropriate amount of time, pressure upon the upper chase 130 is removed, the upper chase 130 and middle chase 140 are moved away from the substrate 150 and the lower chase 160, and the substrate 150 with the semiconductor die 110 covered in mold material 170 (i.e., mold cap) is then removed from the mold tool 100. The process may then be repeated.

It should be noted that although FIGS. 1A-1C show a single mold tool 100, the elements of the mold tool 100 described above may be part of a larger apparatus having multiple cavities each with respective upper chase, middle layer, and lower chase elements, for applying mold material to multiple die/substrate assemblies in a single operation, without departing from the spirit or scope of the present disclosure. In another example, the elements of the mold tool 100 can be part of a larger apparatus having a single cavity into which multiple die are molded as a single system-in-package, for example each die having a respective die seal disposed in the mold tool 100. In yet another example, the elements of the mold tool 100 can be part of a larger apparatus having a single cavity into which multiple independent die are molded in a mass-molding (or gang-molding) fashion and later separated into single packages. In such multi-die configurations, the molding can be performed using a single continuous seal having a set of seal features as discussed herein (e.g., a single set of seal features for the multiple die and/or a respect set of seal features for each of the multiple die), or can be performed using multiple seals, one for each respective die, and each having a respective set of seal features as discussed herein.

Figure 2A:
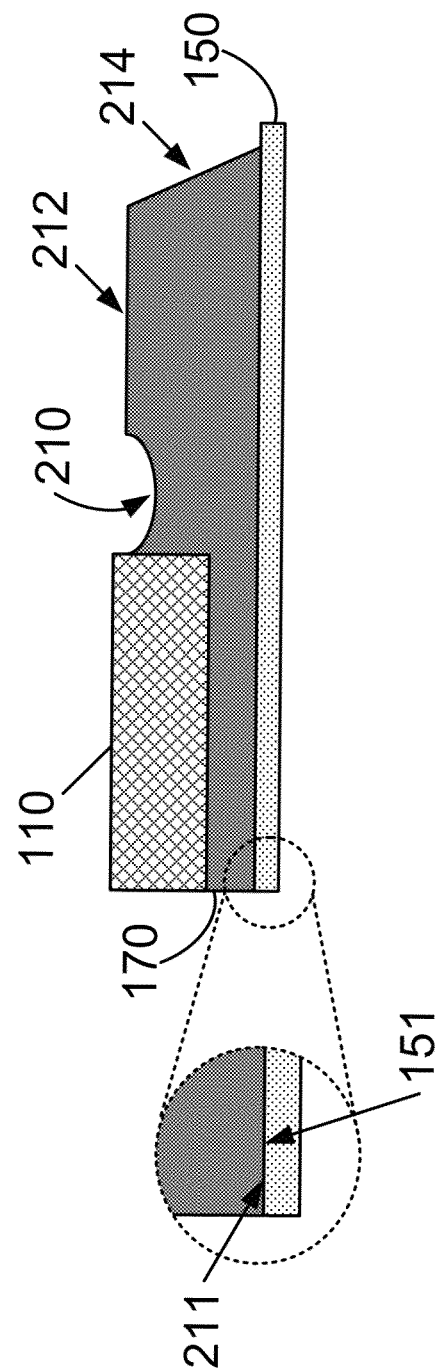
FIG. 2A is an enlarged partial cross sectional view of an example of a mold cap with constant thickness.

FIG. 2A is an enlarged partial cross sectional view of an example of a mold cap with constant thickness. Referring to FIG. 2A, there is shown a standard or typical mold cap made of the mold material 170 described above. The shape or geometry of the mold cap can be such that one of its surfaces is in contact with a surface of the substrate 150. For example, as shown in the inset, a surface 211 of the mold cap can be in contact with a surface 151 of the substrate 150. Opposite to the surface 211 of the mold cap, there can be an undercut 210 produced by the bulging of the die seal 120 during the packaging operation. One portion of the undercut 210 can be next to or adjacent to the semiconductor die 110 while another portion of the undercut 210 can be next to or adjacent to a surface 212 of the mold cap, which in turn is substantially parallel to the surface 211 of the mold cap that is in contact with the substrate 150. The surface 212 of the mold cap can extend from the undercut 210 until close to the edge of the substrate 150 where a surface 214 of the mold cap terminates the edge portion of the mold cap.

Because the region or portion of the mold cap between the undercut 210 and the edge of the substrate 150 has a thickness that is substantially constant, this implementation is generally referred to as a constant thickness mold cap. The constant thickness mold cap can also be referred to as a continuous mold cap because it is typically made of a single molding material. Thus, the full topside of the electronic package can be molded using a solid layer of mold compound around the semiconductor die 110. As noted above, molding the topside of the electronic package can help protect the semiconductor die from damage but can also offer mechanical support to improve and/or maintain the flatness of the electronic package after assembly.

Having a constant mold cap geometry with a solid layer of mold compound can create a symmetric warpage response across the package. With the coefficient of thermal expansion mismatch between the semiconductor die and the substrate, localized warpage can occur particularly around the die perimeter area. By customizing the warpage response of the mold compound (i.e., the mold cap), the localized warpage can be controlled so that it is reduced or substantially minimized. Moreover, by controlling the areas where the mold compound contacts the substrate around the perimeter of the semiconductor die as well as the thickness of the mold compound, a mold structure can be made with different CTE values, modulus values, and/or structural support. Such a mold structure can increase the electronic package reliability by reducing or minimizing warpage across the substrate and/or by lowering the overall stress distribution on the electronic package.

Figure 2B:
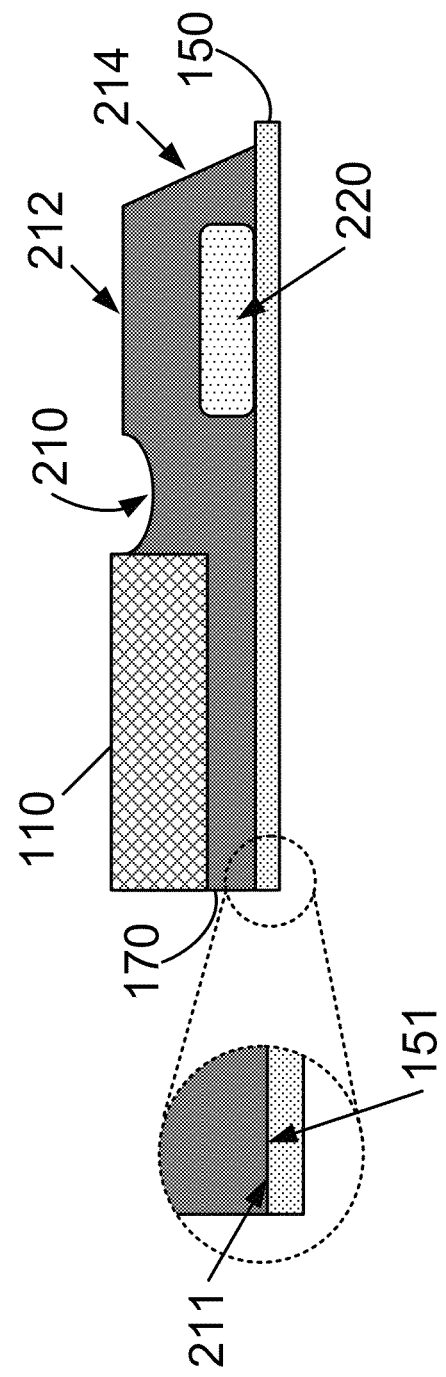
FIGS. 2B and 2C are each an enlarged partial cross sectional view of an example of a mold cap with one or more embedded materials.
Figure 2C:
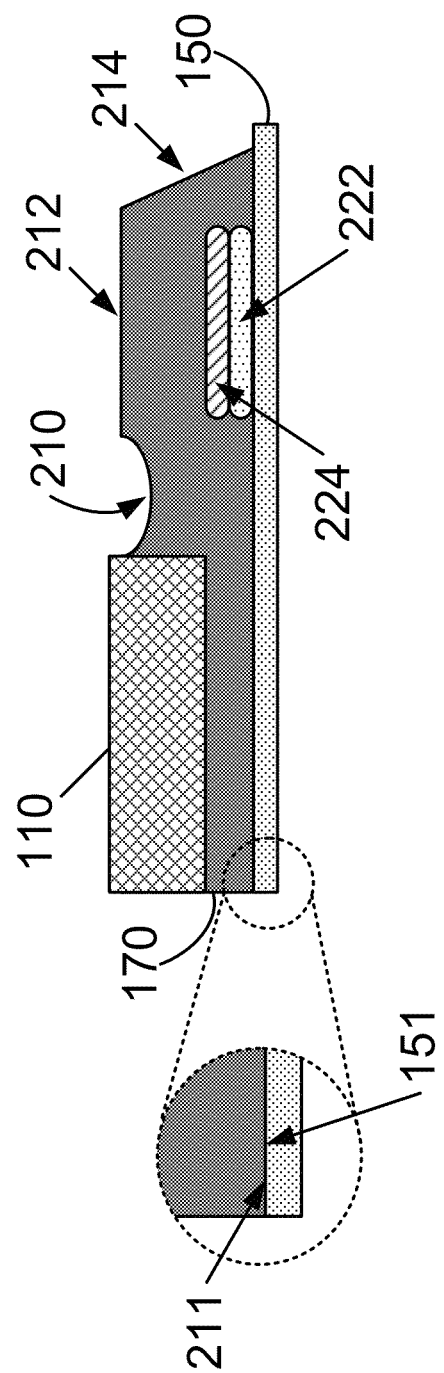

FIGS. 2B and 2C are each an enlarged partial cross sectional view of an example of a mold cap with one or more embedded materials. Referring to FIG. 2B, there is shown a mold cap having a material 220 inside or embedded in the mold material 170. The material 220 can be placed on the surface 151 of the substrate 150 before the mold material 170 is applied, that is, before a molding underfilled (MUF) step takes place. The material 220 can have a modulus value that is lower than that of the mold material 170. The modulus can refer to the flexural modulus, for example. The location, thickness, design, and/or geometry of the material 220 can be controlled to produce a particular warpage and/or stress response on the substrate 150 and/or on the semiconductor die 110.

While a single deposition or placement of the material 220 is illustrated in FIG. 2B, other implementations can be used in which there may be multiple placements of the material 220 and/or of other similar materials, all of which can be embedded in the mold material 170 to produce a particular warpage and/or stress response on the substrate 150 and/or on the semiconductor die 110.

The approach described above in connection with FIG. 2B can be used with both large molded packages as well as with those that use thin, coreless, and/or non-rigid substrates. The mold cap that is produced can remain flat (e.g., entirely flat on the top side, substantially flat on the top side except for an undercut, etc.) for a customer to use a planar surface for a thermal solution interface. Note that such flatness, included in various embodiments, is by no means necessary. For example, any or all aspects of the present invention may be combined with mold cap (or molding process) aspects discussed in U.S. patent application Ser. No. 13/654,567, titled "Design and Method for Controlling Molding Compound Geometry Around a Semiconductor Die", filed Aug. 1, 2012; U.S. patent application Ser. No. 13/546,870, titled "Die Seal Design and Method and Apparatus for Integrated Circuit Production", filed Jul. 11, 2012; and U.S. patent application Ser. No. 13/614,631, titled "Molded Electronic Package Geometry to Control Warpage and Die Stress", filed Sep. 13, 2012. The entire content of each of the patent applications listed above is hereby incorporated herein by reference in its entirety. Moreover, the embedded material can be of lower cost (e.g., lower cost per unit of volume) than the mold material to produce a solution with a lower overall cost.

Referring to FIG. 2C, there is shown a mold cap having materials 222 and 224 inside or embedded in the mold material 170. The material 222 can be placed on the surface 151 of the substrate 150 and the material 224 can be placed above or on top of the material 222. Both materials can be deposited or placed before the mold material 170 is applied, that is, before a MUF step takes place. Materials 222 and 224 can have different modulus values, which can be lower than the modulus value of the mold material 170. The location, thickness, and/or geometry of the embedded materials can be controlled to produce a particular warpage and/or stress response on the substrate 150 and/or on the semiconductor die 110.

While a single deposition or placement of the stacked materials 222 and 224 is illustrated in FIG. 2C, other implementations can be used in which there may be multiple placements of stacked materials embedded in the mold material 170 to produce a particular warpage and/or stress response on the substrate 150 and/or on the semiconductor die 110 (e.g., stacked and/or side-by-side placements). Moreover, there can be implementations in which more than two materials can be stacked in a manner similar to that shown in FIG. 2C.

Figure 3A:
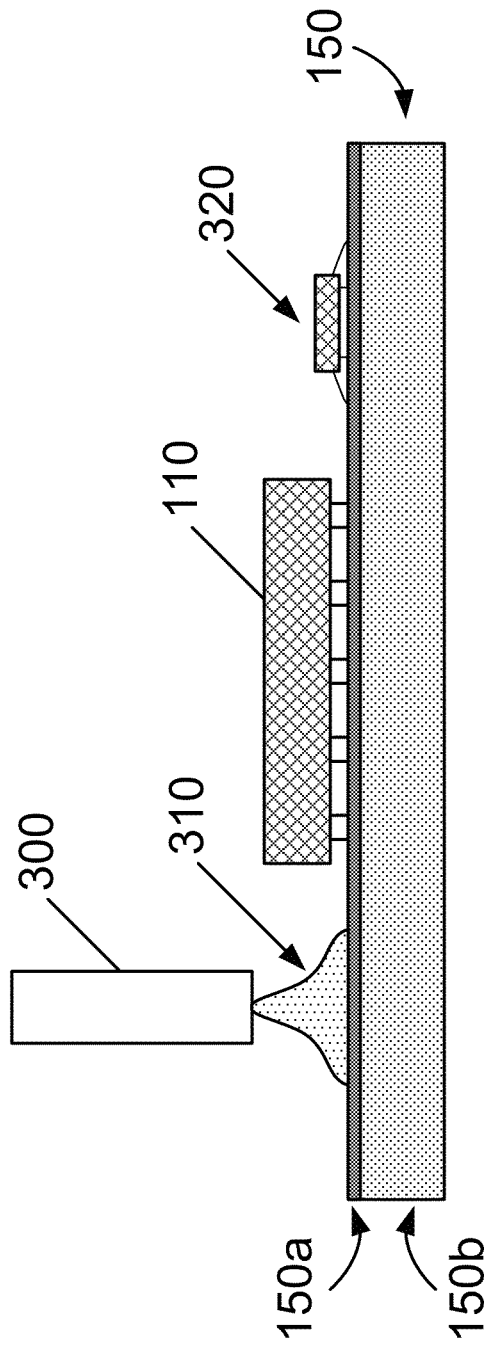
FIG. 3A is a diagram that illustrates an example of the dispensing of a mold cap recess form material on a substrate.

FIG. 3A is a diagram that illustrates an example of the dispensing of a mold cap recess form material on a substrate. Referring to FIG. 3A, there is shown the substrate 150 prior to the application of the mold material 170. In this example, an embedded or form material 310 can be dispensed on a top portion 150a of the substrate 150. The substrate 150 can have a lower portion 150b when the substrate 150 includes a core. The material 310 can be applied using a nozzle 300 or other similar device, which enables an amount of material 310 to be deposited in a particular location. The shape and size of the nozzle 300 can control the manner in which the material 310 is dispensed. For example, the amount of material dispensed, the shape of the material dispensed, and/or the flow rate with which the material is dispensed can be controlled by the characteristics of the nozzle 300. In some implementations, different nozzles can be used to dispense different materials or to dispense the same material in different ways.

In the example illustrated in FIG. 3A, there can be one or more components 320 placed on the substrate 150. The components 320 can include passive components such as die-side capacitors, for example. The components 320 can be encapsulated or covered with a material such as the embedded material 310, for example. In some implementations, the material that is used to encapsulate the components 320 can be different from the embedded material that is dispensed on the substrate 150. Moreover, different materials can be used to encapsulate different types of components.

The dispensing of the recess form or embedded material can enable the application of a wide range of shapes on the topside of the package prior to the molding process. By controlling the shape of the material and/or the content of the material, the resultant shape response through temperature cycling can be customized. Note that although a dispensing technique is discussed herein, a placement technique for relatively solid material may also and/or alternatively be utilized.

Figure 3B:
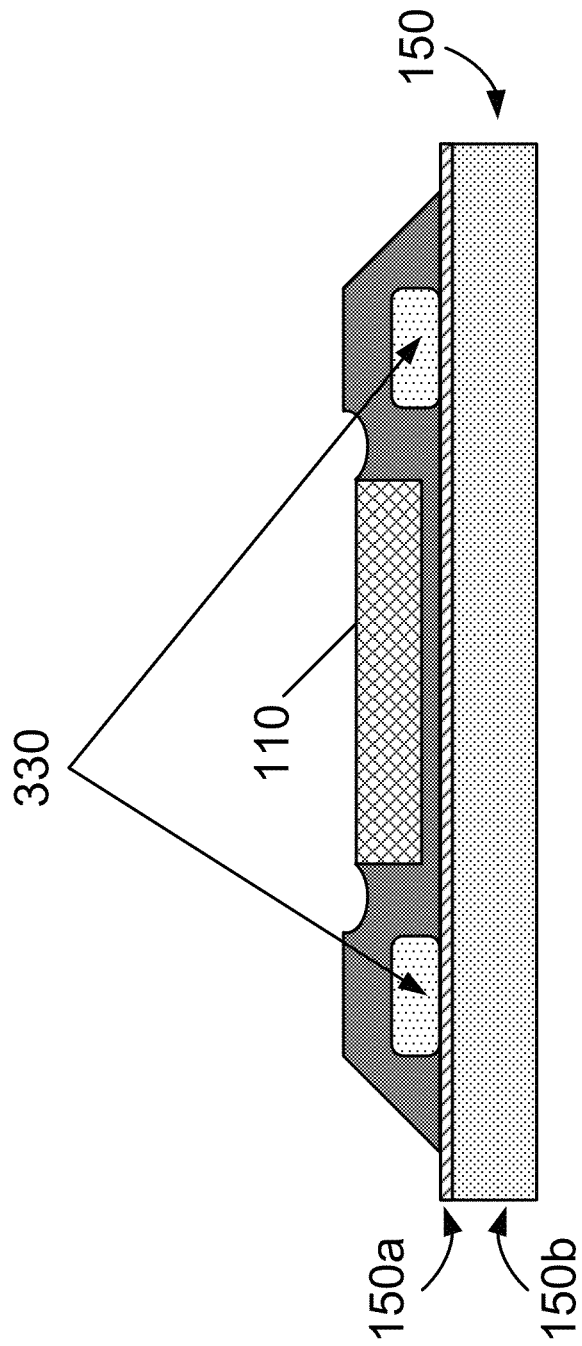
FIG. 3B is a diagram that illustrates an example of the dispensed form material on a substrate and under the mold cap material.

FIG. 3B is a diagram that illustrates an example of the dispensed form material on a substrate and under the mold cap material. Referring to FIG. 3B, there is shown a mold cap with embedded materials 330. While the embedded materials 330 are shown as being symmetrically placed about the semiconductor die 110 (e.g., using the same placement between opposite sides of one or more die, the same placement between all sides of one or more die, a continuous placement around the entire perimeter of one or more die, etc.), other implementations can be used in which the embedded materials 330 can be placed on the substrate 150 in a pattern that not only produces the desired warpage and/or stress response but that can also encapsulate one or more components. Such a pattern need not be symmetric about the semiconductor die 110.

FIG. 4A is a perspective view of an example of a displacement contour plot of simulated warping in a mold cap with constant thickness. Referring to FIG. 4A, there are shown warping simulation results when cooling down an electronic package 400 from a cure temperature of about 165 degrees Celsius (° C.) to a room temperature of about 25° C. The electronic package 400 can have a semiconductor die 410, a substrate 430, and a mold cap 440 with a constant thickness.

The regions 420 indicate those portions of the mold cap 440 in the electronic package 400 where downward warping or bending occurs. The regions 420 are close to and surround portions of the semiconductor die 410, which can produce warpage and/or stresses in the semiconductor die 410. The corners of the electronic package 400 show a slight upward warping or bending as a result of the cool down to room temperature.

Figure 4B:
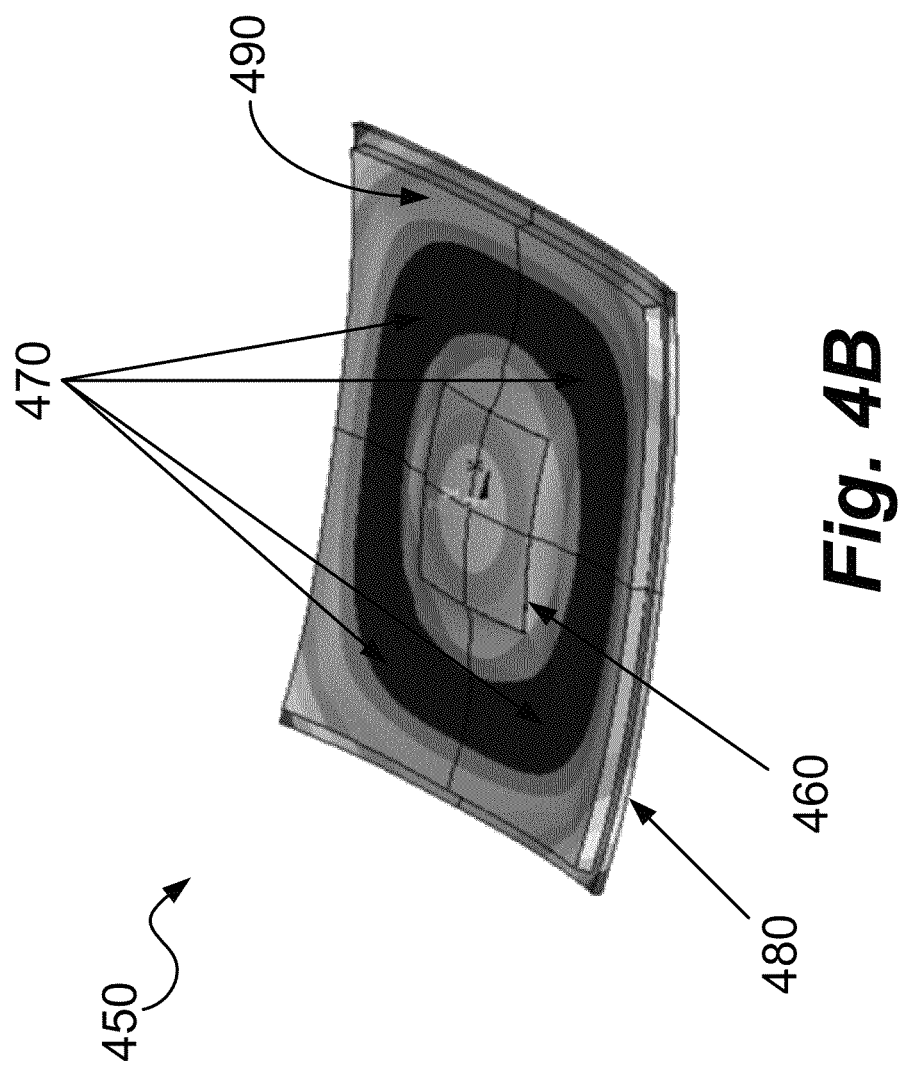
FIG. 4B is a perspective view of an example of a displacement contour plot of simulated warping in a mold cap with constant thickness and having a different material under the mold cap.

FIG. 4B is a perspective view of an example of a displacement contour plot of simulated warping in a mold cap with constant thickness and having a different material under the mold cap. Referring to FIG. 4B, there are shown warping simulation results that occur when an electronic package 400 is cooled down from a cure temperature of about 165° C. to a room temperature of about 25° C. The electronic package 450 can have a semiconductor die 460, a substrate 480, and a mold cap 490 with a constant thickness. The dimensions of the electronic package 450 and of the semiconductor die 460 can be substantially similar to those of the electronic package 400 and the semiconductor die 410, respectively, for example. The mold cap 490 can have an embedded material as illustrated by the examples described above with respect to FIGS. 2B, 2C, 3A, and 3B, for example. In this example, the embedded or form material used can be DCL-5. Typically, materials that have a modulus and/or CTE that is different from that of the molding compound can be used as embedded or form materials.

The regions 470 indicate those portions of the electronic package 450 where downward warping or bending can occur.

When compared with the regions 420 in FIG. 4A, the regions 470 occur farther away from the semiconductor die 460 than the regions 420 from the semiconductor die 410. Thus, the warping that may occur in an electronic package with the embedded material in the mold cap is likely to produce less warpage and/or stresses in the semiconductor die than in an electronic package with a solid layer of molding material. The corners of the electronic package 450 show a slight upward warping or bending as a result of the cool down to room temperature.

In the results shown in FIGS. 4A and 4B, the warpage produced by using a mold cap with an embedded material can be about 15-20 percent less than that produced with a solid layer mold cap.

Figure 5:
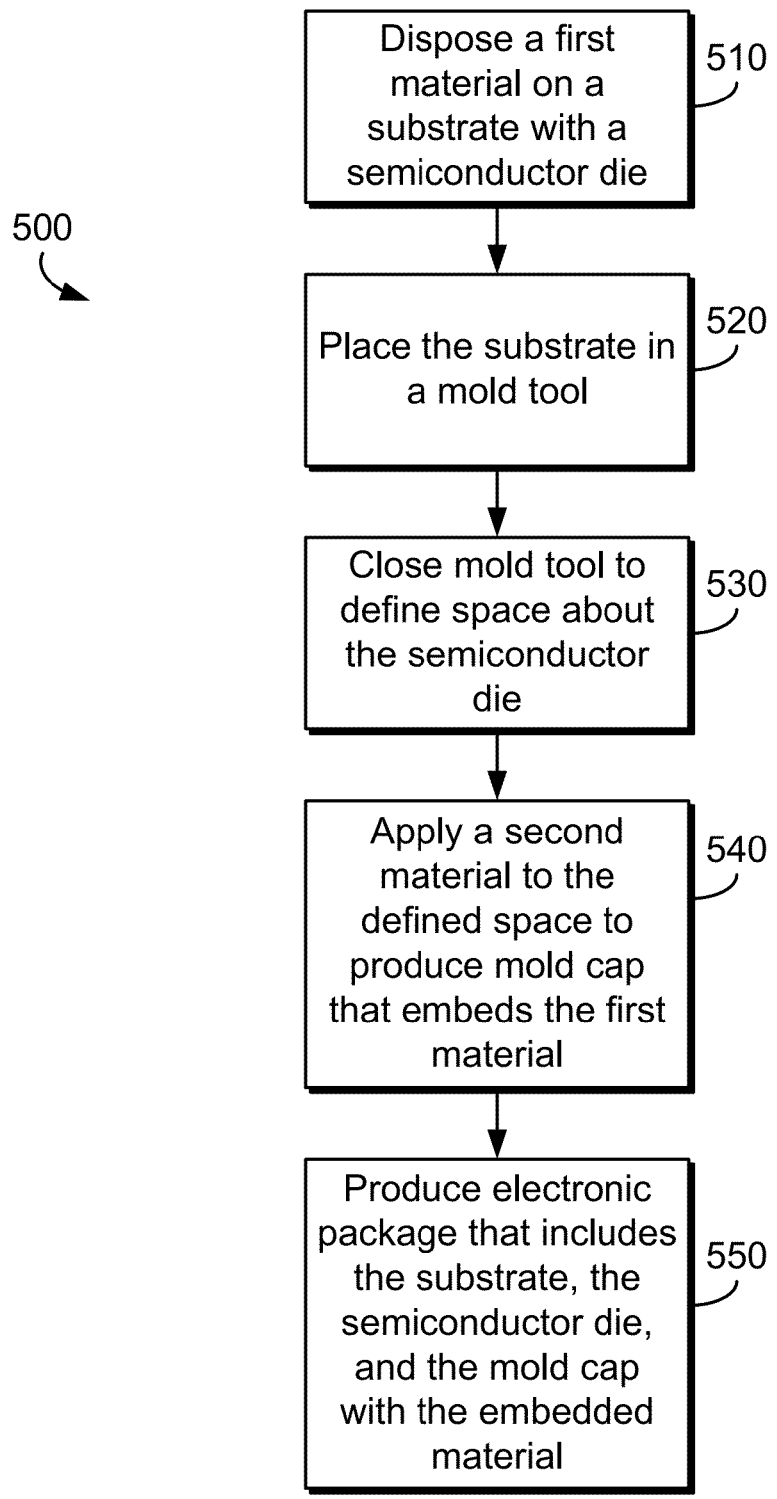
FIG. 5 is flow chart that illustrates examples of steps for producing an electronic package with a mold cap having an embedded material.

FIG. 5 is flow chart that illustrates examples of steps for producing an electronic package with a mold cap having an embedded material. Referring to FIG. 5, there is shown a flow chart 500 in which, at step 510, a first material is disposed on substrate (e.g., a coreless substrate) with a semiconductor die. The first material can be an embedded or form material dispensed by a nozzle or some other similar device as illustrated in FIG. 3A, for example. At step 520, the substrate with the material can be placed in a mold tool (e.g., the mold tool 100). At step 530, the mold tool can be closed to define a space or cavity about the semiconductor die where a second material such as mold material or mold compound (e.g., epoxy mold compound) can be introduced.

At step 540, the second material can be applied to the defined space to produce a mold cap that embeds the first material in the second material such as the mold cap examples illustrated in FIGS. 2B and 2C, for example. At step 550, an electronic package can be produced that includes the substrate, the semiconductor die, and the mold cap with the embedded material. Note that the first and second materials (and/or other materials) may be cured consecutively and/or simultaneously during processing.

In connection with the steps described above for the flow chart 500, the first material can have a modulus with a value that is lower than a value of a modulus of the second material. In some implementations, the CTE of the first material can be different from the CTE of the second material. In some instances, a flexible die seal (e.g., the die seal 120) can be applied to a surface of the semiconductor die, which can result in an undercut on a surface of the mold cap adjacent to the semiconductor die.

Moreover, a portion of a surface of the substrate can include one or more electrical components that can be at least partially covered or encapsulated by the first material. The electrical components can include passive electrical components (e.g., capacitors, inductors) and/or active components (e.g., transistors, amplifiers).

In another implementation, an electronic package can be produced by disposing multiple form or embedded materials on a first portion of a surface of a substrate. The substrate can have a semiconductor die disposed on a second portion of the surface different from the first portion. The substrate can then be placed on a mold tool (e.g., the mold tool 100), which in turn can be closed to define a space about the semiconductor die. A molding material can be applied to at least a portion of the defined space to produce a mold cap such that the multiple materials on the surface of the substrate can be at least partially embedded in the molding material. An example of a mold cap with multiple embedded materials is illustrated in FIG. 2C.

In another implementation, an electronic package can include a substrate having a first material other than an electronic component (e.g., capacitor, inductor) disposed on a first portion of a surface of the substrate, a semiconductor die disposed on a second portion of the surface of the substrate different from the first portion, and a mold cap that includes a second material. The second material of the mold cap can be disposed about the semiconductor die such that the first material can be at least partially embedded in the second material. Examples of mold caps in which a first material on the surface of the substrate is embedded in a second material are illustrated in FIGS. 2B and 2C.

While the present disclosure has been described with reference to certain implementations, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular implementations disclosed, but that the present disclosure will include all implementations falling within the scope of the appended claims.

What is claimed is:

1. A method, comprising:
    disposing a first material on a first portion of a surface of a substrate, the substrate having a semiconductor die disposed on a second portion of the surface different from the first portion, wherein the semiconductor die is not in contact with the first material;
    placing the substrate in a mold tool;
    closing the mold tool to define a space about the semiconductor die;
    applying a flexible die seal to a surface of the semiconductor die such that the flexible die seal bulges adjacent to the semiconductor die; and
    applying a second material to at least a portion of the defined space to produce a mold cap comprising an undercut formed in a top surface of the mold cap opposite a bottom surface that is in contact with the substrate, wherein the first material is at least partially embedded in the second material.

2. The method of claim 1, wherein the first material has a modulus with a value that is lower than a value of a modulus of the second material.

3. The method of claim 1, wherein the second material includes an epoxy mold compound.

4. The method of claim 1, wherein a coefficient of thermal expansion (CTE) of the first material is different from a CTE of the second material.

5. The method of claim 1, wherein the bulge in the flexible die seal produces the undercut on the top surface of the mold cap adjacent to the semiconductor die.

6. The method of claim 1, wherein the substrate includes a coreless substrate.

7. The method of claim 1, wherein the first portion of the surface of the substrate includes one or more electrical components, the method comprising covering at least a portion of the one or more electrical components with the first material.

8. The method of claim 1, wherein the one or more electrical components include passive electrical components.

9. A method, comprising:
    disposing a plurality of materials on a first portion of a surface of a substrate, the substrate having a semiconductor die disposed on a second portion of the surface different from the first portion, wherein the semiconductor die is not in contact with the plurality of materials;
    placing the substrate in a mold tool;
    closing the mold tool to define a space about the semiconductor die;

applying a flexible die seal to a surface of the semiconductor die such that the flexible die seal bulges adjacent to the semiconductor die; and applying a molding material to at least a portion of the defined space to produce a mold cap comprising an undercut formed in a top surface of the mold cap opposite a bottom surface that is in contact with the substrate, wherein the plurality of materials are at least partially embedded in the molding material.

10. The method of claim 9, wherein the molding material has a modulus with a value that is higher than a value of a modulus of each of the plurality of materials.

11. The method of claim 9, wherein the molding material includes an epoxy mold compound.

12. The method of claim 9, wherein a coefficient of thermal expansion (CTE) of each of the plurality of materials is different from a CTE of the molding material.

13. The method of claim 9, wherein the bulge in the flexible die seal produces the undercut on the top surface of the mold cap adjacent to the semiconductor die.

14. The method of claim 9, wherein the substrate includes a coreless substrate.

15. The method of claim 9, wherein the first portion of the surface of the substrate includes one or more electrical components, the method comprising covering at least a portion of the one or more electrical components with the plurality of materials.

16. The method of claim 9, wherein the one or more electrical components include passive electrical components.

* * * * *